US008593532B2

(12) United States Patent
Lee

(10) Patent No.: US 8,593,532 B2
(45) Date of Patent: Nov. 26, 2013

(54) OPTICAL IMAGE STABILIZER EMPLOYING A SCRATCH DRIVE ACTUATOR

(75) Inventor: Seung Seoup Lee, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 461 days.

(21) Appl. No.: 12/926,371

(22) Filed: Nov. 12, 2010

(65) Prior Publication Data

US 2012/0013754 A1 Jan. 19, 2012

(30) Foreign Application Priority Data

Jul. 15, 2010 (KR) ........................ 10-2010-0068568

(51) Int. Cl.
*H04N 5/228* (2006.01)
(52) U.S. Cl.
USPC .................................................. 348/208.99
(58) Field of Classification Search
USPC .................. 438/64; 348/208.99, 208.5, 208.7
See application file for complete search history.

(56) References Cited

U.S. PATENT DOCUMENTS

| 6,366,414 | B1 * | 4/2002 | Aksyuk et al. | 359/822 |
| 7,633,687 | B2 * | 12/2009 | Horng et al. | 359/697 |
| 7,663,289 | B1 * | 2/2010 | Gutierrez | 310/309 |
| 2007/0279497 | A1 * | 12/2007 | Wada et al. | 348/208.7 |
| 2009/0009034 | A1 * | 1/2009 | Nishioka | 310/323.16 |
| 2009/0135260 | A1 * | 5/2009 | Rouvinen et al. | 348/208.11 |

FOREIGN PATENT DOCUMENTS

KR 10-2008-0112662 12/2008
KR 10-2009-0010766 1/2009

OTHER PUBLICATIONS

Akiyama et al.; "Scratch Drive Actuator with Mechanical Links for Self-Assembly of Three-Dimensional MEMS"; Mar. 1997; Journal of Microelectromechanical Systems, vol. 6, No. 1; pp. 10-17.*
Huang et al.; "Novel Bounce Drive Actuator for Large Step Displacement and Low Friction Micrometer Applications", Jan. 6-9, 2008; Proceedings of the 3rd IEEE Int. Conf. on Nano/Micro Engineered and Molecular Systems; pp. 1164-1167.*

* cited by examiner

*Primary Examiner* — Gary C Vieaux

(57) ABSTRACT

The present invention provides an optical image stabilizer including: a substrate; a table which faces the substrate and has an image sensor mounted on its upper surface to be horizontally actuated on the substrate; supporting members for supporting the table on the substrate; and a scratch drive actuator for actuating the table, and a method for manufacturing thereof.

12 Claims, 9 Drawing Sheets

100

140a

140a

OPTICAL IMAGE STABILIZER EMPLOYING A SCRATCH DRIVE ACTUATOR

CROSS-REFERENCE(S) TO RELATED APPLICATIONS

This application claims the benefit under 35 U.S.C. Section [120, 119, 119(e)] of Korean Patent Application Serial No. 10-2010-0068568, entitled "Optical Image Stabilizer And Method Of Manufacturing The Same," filed on Jul. 15, 2010, which is hereby incorporated by reference in its entirety into this application.

BACKGROUND OF THE INVENTION

1. Field of the Invention

The present invention relates to an optical image stabilizer and a method for manufacturing the same; and, more particularly, to an optical image stabilizer for driving an image sensor and a method for manufacturing the same.

2. Description of the Related Art

In general, a recent mobile communication terminal tends to be equipped with a camera device. In particular, such mobile communication terminals are frequently used when users on move photograph desired images. Therefore, in order to obtain a high-quality image, mobile communication terminals have been required to include an image stabilizer for correcting an image blurred due to hand's shake.

In particular, as a camera device is provided with an image stabilizer, it is possible to obtain a clear image even in environments (e.g. in dark room or at nighttime) where shutter's speed is low owing to light's lack.

An Optical Image Stabilizer (OIS) of various image stabilizers provides a correction function to prevent an image on an image sensor from being shaken by a change in a location of an optical lens or an image sensor, even if trembling occurs at photographing.

Herein, as an image stabilizer for moving an optical lens requires an enough space to accommodate a drive unit for driving the optical lens, the image stabilizer has a limitation to be incorporated into a mobile communication terminal with an insufficient space. On the other hand, an image stabilizer for moving an image sensor requires a relatively smaller mounting-space over the image stabilizer for moving the optical lens.

Thus, in order to be applicable to a mobile communication terminal, various technologies have been developed to implement an image stabilizer which can move an image sensor. However, there still exist many difficulties to satisfy limited drive displacement and restricted space of an image sensor.

SUMMARY OF THE INVENTION

The present invention has been proposed in order to overcome the above-described problems and it is, therefore, an object of the present invention to provide an optical image stabilizer for correcting images blurred due to hand-shake by driving an image sensor, and a method for manufacturing the same.

In accordance with one aspect of the present invention to achieve the object, there is provided an optical image stabilizer including: a substrate; a table which faces the substrate and has an image sensor mounted on its upper surface to be horizontally actuated on the substrate; supporting members for supporting the table on the substrate; and a scratch drive actuator for actuating the table.

Also, the scratch drive actuator includes: an electrode layer which is disposed on the substrate and generates electrostatic force; and scratch drive arrays which are disposed on the electrode layer and movable in predetermined directions by the electrostatic force.

Also, the scratch drive arrays includes: a plurality of scratch drive units which are spaced apart from the substrate, the scratch drive units each including a plate part parallel to the substrate and a bushing part bent at one side surface of the plate part; and a beam part for interconnecting the scratch drive units to one another.

Also, the scratch drive arrays are disposed between the substrate and the table.

Also, the electrode layer includes an electrode pattern patterned to correspond to each of the scratch drive arrays.

Also, the scratch drive arrays are movable in mutually different directions from one another.

Also, the supporting members and the beam parts are formed in a body.

Also, the electrode layer is formed of a conductor made of metal or poly silicon.

Also, the scratch drive arrays are formed of silicon.

Also, the optical image stabilizer further comprises an insulating pattern interposed between the supporting members and the table.

Also, the table is formed of silicon.

Also, the image sensor is mounted by a wire bonding scheme or a flip-chip bonding scheme.

In accordance with another aspect of the present invention to achieve the object, there is provided a method for an optical image stabilizer including the steps of: providing an SOI wafer substrate which has a plurality of cells, the SOI wafer substrate including an insulating layer, and first and second silicon layers disposed on both sides of the insulating layer; forming scratch drive arrays and supporting members on each of the cells by etching the first silicon layer; forming the table through cells' separation by etching the second silicon layer and the insulating layer; removing the insulating layer interposed between the scratch drive arrays and the table; mounting the image sensor on the table; forming the substrate which has an electrode layer corresponding to the scratch drive arrays; and assembling the table with the image sensor and the scratch drive arrays on the substrate having the electrode layer in such a manner that the scratch drive arrays face the electrode layer each other.

Also, the step of forming the scratch drive arrays includes the steps of: forming a first resist pattern on the first silicon layer of the SOI wafer substrate; forming a bushing part and a beam part connected to the bushing part by etching the first silicon layer through use of the first resist pattern as an etching mask; forming a second resist pattern on the first silicon layer on which the bushing part and the beam part are formed; and forming a plate part by etching the first silicon layer through use of the second resist pattern as an etching mask.

Also, in the step of forming the bushing part and the beam part, the supporting members are further formed.

Also, the scratch drive arrays are formed in plural numbers.

Also, the step of forming the substrate having the electrode layer corresponding to the scratch drive arrays includes a step of forming an electrode pattern to correspond to each of the scratch drive arrays.

Also, the method further includes a step of forming a protective film for each cell including the scratch drive arrays, before the step of forming the table through cells' separation by etching the second silicon layer and the insulating layer.

Also, the step of forming the substrate including the electrode layer corresponding to the scratch drive arrays includes the steps of: forming an insulating layer on the substrate; forming a poly silicon layer on the insulating layer; and forming an electrode layer by etching the poly silicon layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
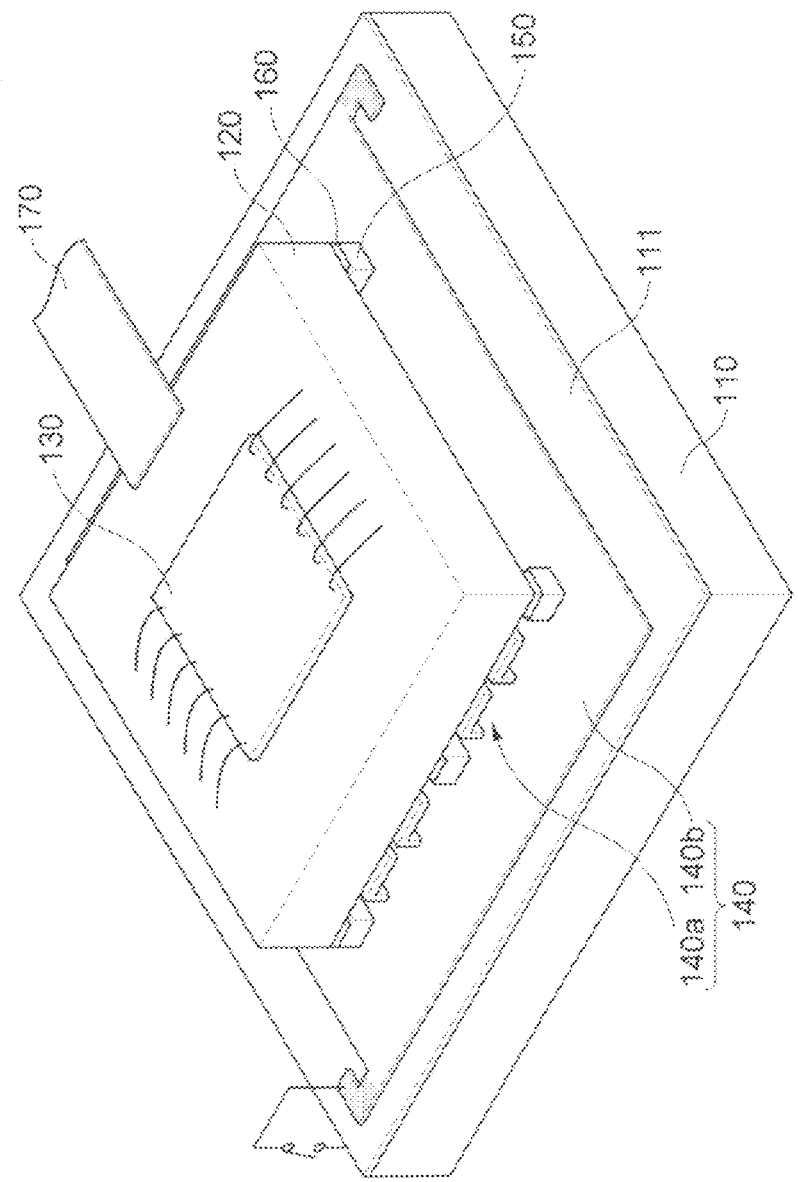
FIG. 1 is a perspective view showing an optical image stabilizer in accordance with a first embodiment of the present invention.

Embodiments of an optical image stabilizer in accordance with the present invention will be described in detail with reference to the accompanying drawings. When describing them with reference to the drawings, the same or corresponding component is represented by the same reference numeral and repeated description thereof will be omitted.

FIG. 1 is a perspective view showing an optical image stabilizer in accordance with a first embodiment of the present invention.

Figure 2:
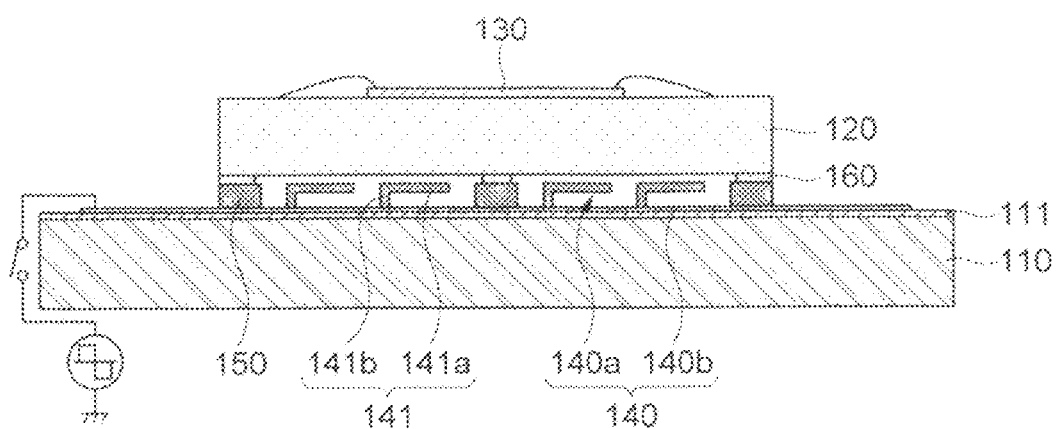
FIG. 2 is a cross-sectional view showing the optical image stabilizer of FIG. 1.

FIG. 2 is a cross-sectional view showing the optical image stabilizer of FIG. 1.

Referring to FIGS. 1 and 2, the optical image stabilizer 100 in accordance with the embodiment of the present invention may be formed to be in a Micro Electro Mechanical System (MEMS) structure so as to implement miniaturization. At this time, the optical image stabilizer 100 may correct images blurred due to hand's shake by changing the location of an image sensor.

In particular, the optical image stabilizer 100 may include a substrate 110, a table 120, supporting members 150, and a scratch drive actuator 140.

Since the substrate 110 is made from a Silicon On Insulator (SOI) wafer, it may be made of silicon.

The table 120 may be disposed to face the substrate 110. Herein, the table 120 may be actuated on the substrate 110 by being lifted. At this time, an image sensor 130 may be mounted on the top of the table 120. Thus, due to actuation of the table 120, the image sensor 130 may be actuated on the substrate 110 as well.

Herein, the image sensor 130 may be mounted by a wire bonding scheme. However, the embodiment of the present invention is not limited thereto, and may also be mounted by a flip-chip bonding scheme.

Also, the image sensor 130 refers to an element for converting image information into electrical signals. Although it may be formed in one of CCD and CMOS types, the embodiment of the present invention is not limited thereto. At this time, in order to less affect actuation of the table 120, the image sensor 130 may be electrically connected to a signal processing unit (not shown) through a Flexible Printed Circuit Board (FPCB) 110 rather than a rigid PCB.

Since the table 120 may be formed through the MEMS technology employing an SOI wafer, the table 120 may be formed of silicon.

The supporting members 150 may play a role of supporting the table 120 on the substrate 110. Herein, as the supporting members 150 may be formed through the MEMS technology employing the SOI wafer, it may be made of silicon. At this time, an insulating pattern 160 has been interposed between the supporting members 150 and the table 120. As the insulating pattern 160 allows the supporting members 150 and the table 120 to be in contact with each other, the supporting members 150 may support the table 120.

Electrostatic force may be used to fixedly mount the table 120 on the substrate 110. That is, by constantly applying a predetermined voltage to either the substrate 110 or the table 120, there may be produced electrostatic force caused by a voltage difference between the substrate 110 and the table 120. Since the electrostatic force makes the table 120 attracted to the substrate 110, the table 120 may be fixed on the substrate 110.

The scratch drive actuator 140 may be a driving device for actuating the table 120 by using the electrostatic force. Herein, the scratch drive actuator 140 may include scratch drive arrays 140a and an electrode layer 140b disposed on the substrate 110.

The electrode layer 140b may be formed of a conductor. At this time, as for the conductor, poly silicon or metal may be exemplified.

Herein, the electrode layer 140b may have been patterned to make the table 120 movable in a specific direction.

In addition to this, an insulating layer 111 may further be interposed between the substrate 110 and the electrode layer 140b. At this time, the insulating layer 111 may play a role of a buffer for formation of the electrode layer 140b. As for material of the insulating layer 111, $SiO_2$ or $Si_3N_4$ may be exemplified.

Since the scratch drive arrays 140a may be formed through the MEMS technology employing the SOI wafer, the scratch drive arrays 140a may be made of silicon.

Hereinafter, a detailed description will be given of scratch drive arrays, with reference to FIG. 3.

Figure 3:
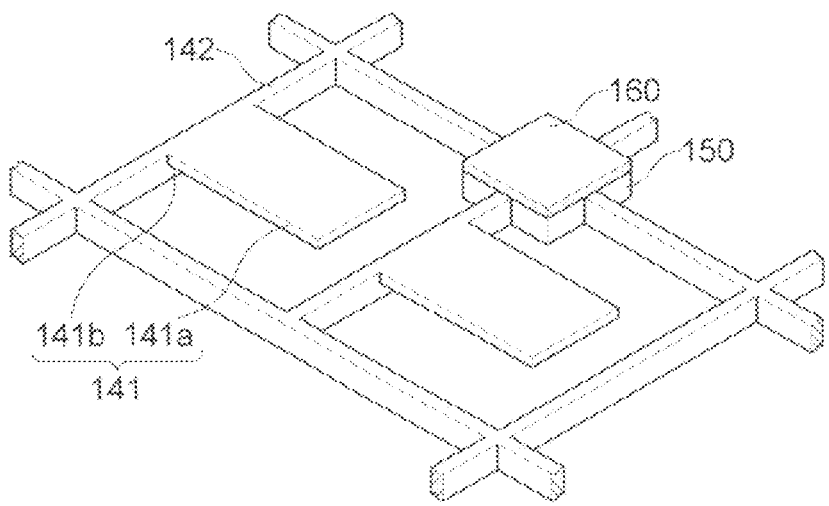
FIG. 3 is a schematic view showing the arrangement of scratch drive arrays of FIG. 1.

FIG. 3 is an expanded view showing a part of the scratch drive arrays shown in FIG. 1.

Referring to FIG. 3, the scratch drive arrays 140a each may include a plurality of scratch drive units 141, and a beam part 142 for interconnecting the scratch drive units 141.

The scratch drive units 141 each may include a plate part 141a spaced apart from the substrate 110, and a bushing part 141b bent at one side surface of the plate part 141a. Herein, the plate part 141a may be spaced apart from the substrate 110 in a parallel relation with respect to the substrate 110. Also, the plate part 141a may have been spaced apart from the table 120. The bushing part 141b may be bent toward the electrode layer 140b. At this time, a lower end of the bushing part 141b may be adhered closely to the electrode layer 140b. Thus, the scratch drive units 141 may be interposed between the table 120 and the substrate 110.

The beam part 142 is connected to the bushing part 141b to thereby interconnect the scratch drive units 141 among themselves. Herein, the beam part 142 may be integrated with the bushing part 141b. Also, the beam part 142 may be connected to the supporting members 150. Herein, the beam part 142 and the supporting members 150 may be formed in a body. Thus, the beam part 142 may be connected to the scratch drive units 141 together with the supporting members 150 at a lower portion of the table 120.

Hereinafter, a driving principle of the scratch drive actuator will be described with reference to FIG. 4.

Figure 4:
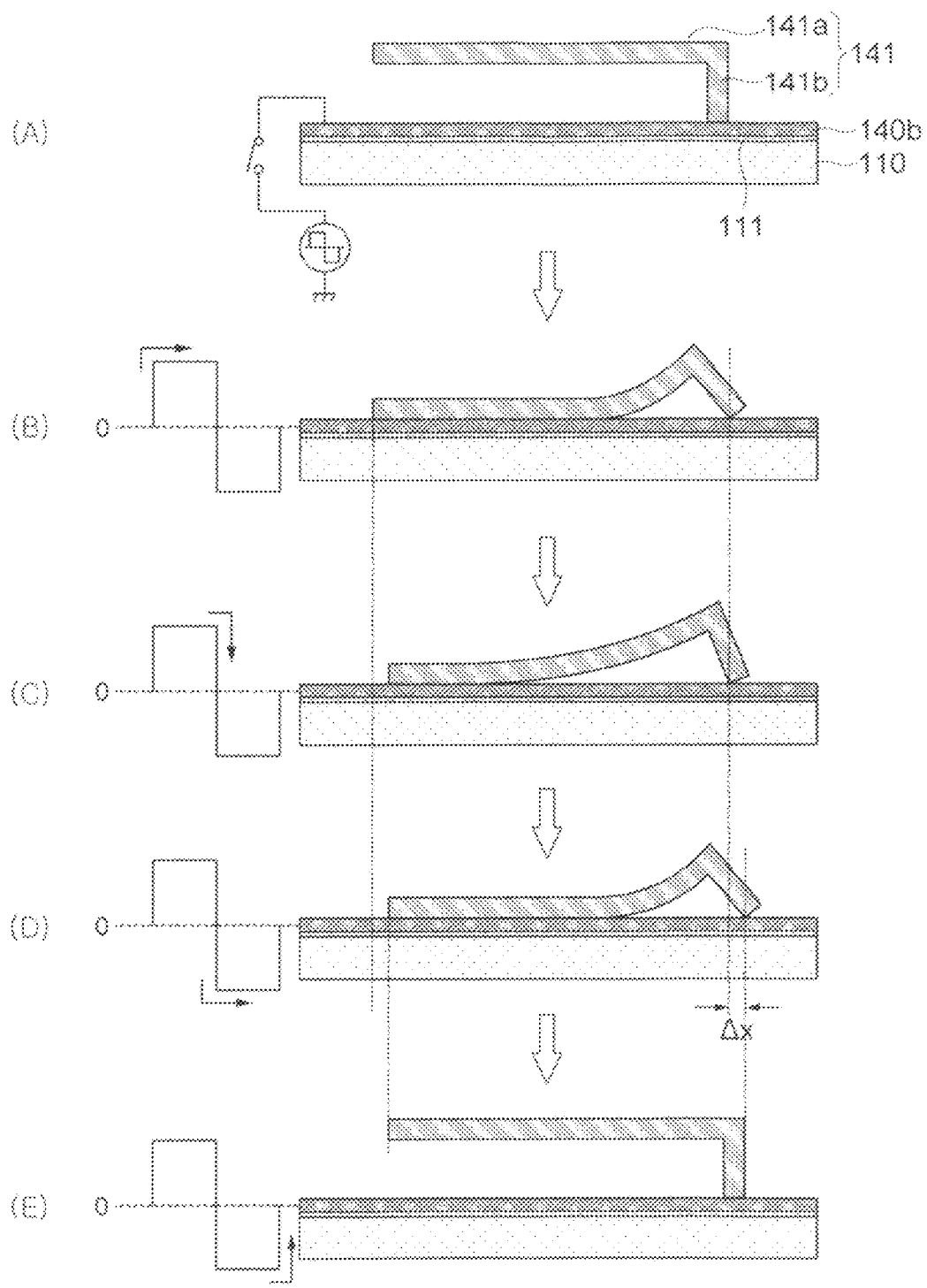
FIG. 4 is a schematic view for explaining how a scratch drive actuator is driven.

FIG. 4 is a schematic view for explaining how the scratch drive actuator is driven.

Referring to FIG. 4, at an initial stage where no voltage is applied to the electrode layer 140b, the plate part 141a is spaced apart from the electrode layer 140b, as shown in (a) of FIG. 4. In case where the voltages of square waveforms are applied to the electrode layer, the electrostatic force makes the electrode layer 140b pulled downward. At this time, one side of the plate part 141a is immovable by being supported by the bushing part 141b, and thus the non-connected other side of the plate part 141a to the bushing part 141b is mainly deformed while being in contact with surfaces of the electrode layer 140b, as shown in (b) of FIG. 4. In case where a voltage applied to the electrode layer 140b returns to zero, the plate part 141a being in contact with the electrode layer 140b tends to be returned to its original position by elastic restoring force, as shown in (c) of FIG. 4. In case where a negative voltage is applied again and thus there is produced a potential difference between the electrode layer 140b and the scratch drive units 141, the scratch drive units 141 are moved forward by $\Delta_X$ in a formation direction of the bushing part 141b since friction force between the bushing part 141b and the electrode layer 140b is even smaller than that between the plate part 141a and the electrode layer 140b, as shown in (d) of FIG. 4. In case where a voltage applied to the electrode layer 140b entirely returns to zero, the scratch drive units 141 are restored in its original shape and are finally moved forward by $\Delta_X$, as shown in (e) of FIG. 4.

Thus, the scratch drive units 141 may be moved by using the electrostatic force generated by the voltage applied to the electrode layer 140b.

Returning to FIGS. 1 to 3, as the scratch drive units 141 in the scratch drive arrays 140a are moved, the supporting members 150 connected to the beam part 142 of the scratch drive arrays 140a are influenced as well, and thus the table 120 supported by the supporting members 150 may be naturally movable.

Herein, a movement direction of the table 120 may be decided by a direction where the scratch drive units 141 are moved, that is, a direction where the bushing part 141b is formed in the scratch drive units 141. At this time, the movement direction of the table 120 may coincide with a direction where the scratch drive units are moved, that is, a direction where the bushing part 141b is formed in the scratch drive units 141.

Thus, the movement direction of the table 120 may be controlled according to the arrangement method and the driving of the scratch drive units 141 provided in the scratch drive array 140a.

Hereinafter, a detailed description will be given of a control method for the movement direction of the table with reference to FIG. 5.

Figure 5:
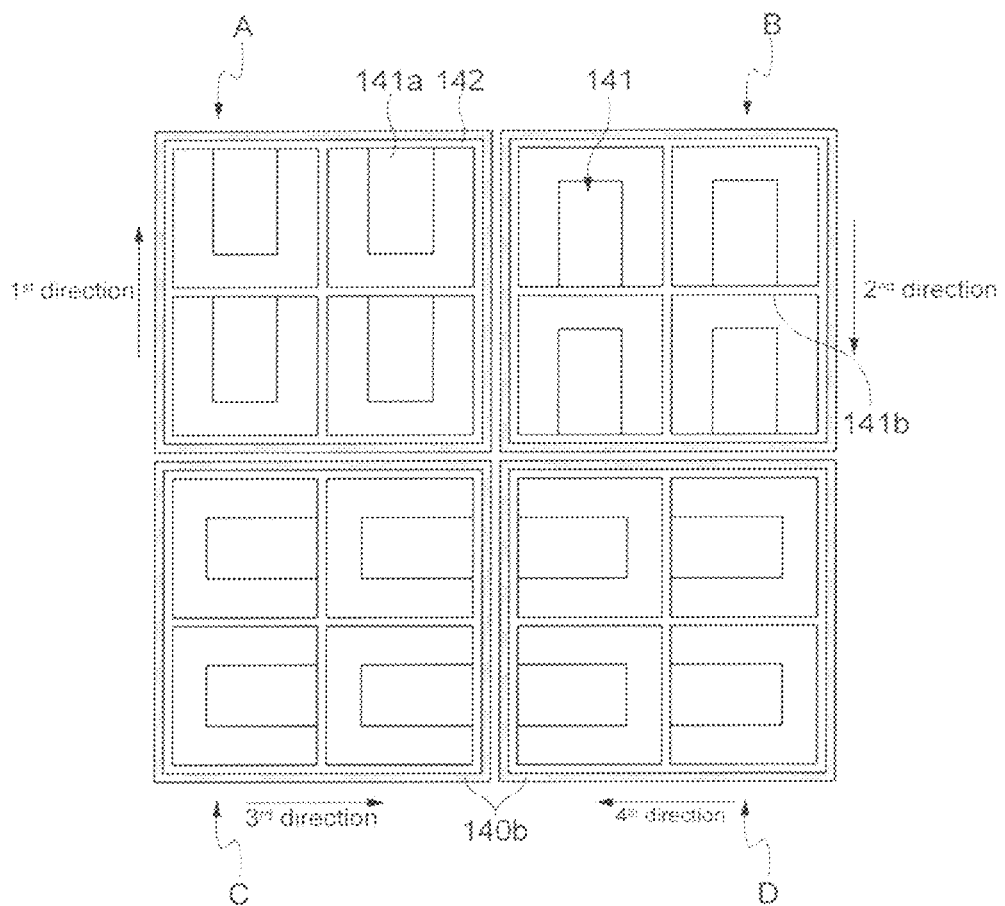
FIG. 5 is a view showing an example where scratch drive units are arranged.
Figure 6:
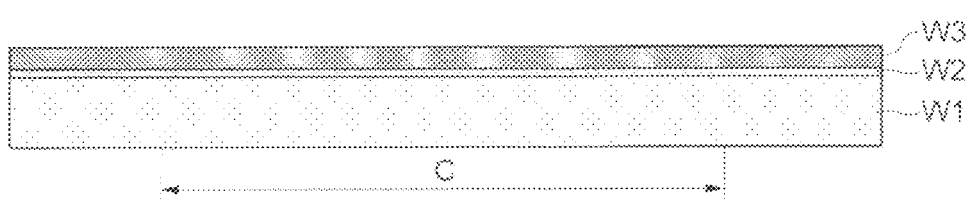
FIGS. 6 to 17 are cross-sectional views showing a process of manufacturing an optical image stabilizer in accordance with a second embodiment of the present invention, respectively.

FIG. 5 is a plan view showing an example where the scratch drive arrays are arranged.

Referring to FIG. 5, the scratch drive arrays A, B, C, and D are provided below the table (indicated by reference numeral 120 of FIG. 1). Herein, the scratch drive arrays A, B, C, and D are arranged separately from one another. At this time, each of the scratch drive arrays A, B, C, and D may include a plurality of scratch drive units (indicated by reference numeral 141 of FIG. 3) which are arranged in the same direction as one another. At this time, the scratch drive units 141 provided in each of the scratch drive arrays A, B, C, and D may be arranged in mutually different directions from one another. Thus, the scratch drive arrays A, B, C, and D may be moved in mutually different directions from one another, for example, first, second, third, and fourth directions.

Also, in order to individually drive the scratch drive arrays A, B, C, and D, the electrode layer 140b may be provided with an electrode pattern patterned to correspond to each of the scratch drive arrays A, B, C, and D.

Thus, it is possible to control the movement direction of the table 120 by forming the scratch drive arrays A, B, C, and D to be movable in different directions from one another and individually driving the formed scratch drive arrays.

Thus, as in the embodiment of the present invention, the optical image stabilizer may be provided with the scratch drive actuator which can generate a force in itself to move the image sensor by the driving principle employing an attraction force, so that the optical image stabilizer may have a simple construction.

Also, the optical image stabilizer of the present invention may be manufactured by the MEMS technology, so that it is possible to reduce a mounting space of a camera device at a micrometer size. In addition, it is possible to implement mass-production and thus to lower module's cost.

Hereinafter, a process of manufacturing the optical image stabilizer according to the present invention will be described in more detail with reference to FIGS. 6 to 21.

FIGS. 6 to 17 are cross-sectional views showing a process of manufacturing an optical image stabilizer in accordance with a second embodiment of the present invention, respectively.

FIGS. 18 to 21 are perspective views showing a process of manufacturing an optical image stabilizer in accordance with a second embodiment of the present invention, respectively. Herein, there is shown only a part of the scratch drive arrays of the optical image stabilizer, for convenience of description.

Referring to FIGS. 6 to 18, in order to manufacture the optical image stabilizer in accordance with the second embodiment of the present invention, a SOI wafer substrate W is first provided. The SOI wafer substrate W may be provided with first and second silicon layers W1 and W2 stacked one above another with respect to an insulating layer W2 interposed therebetween.

Herein, as for material of the insulating layer W2, a silicon oxide film or a silicon nitride film may be exemplified. However, the embodiment of the present invention is not limited thereto.

Also, the SOI wafer substrate W may be sectioned into a plurality of cells C. At this time, each of the cells C may be a region where one optical image stabilizer is formed.

Figure 7:
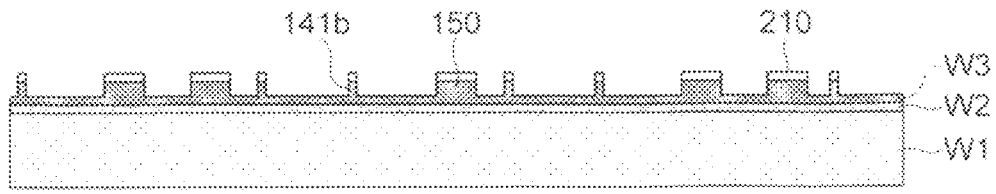

Referring to FIG. 7, after the SOI wafer substrate W is provided, a first resist pattern 210 is formed on the second silicon layer W2. Herein, the first resist pattern 210 may be made by forming a resist layer resulting from dry-film attachment or photosensitive-composition coating on the second silicon layer W2, and then performing exposure and develop processes for the resist layer. Thereafter, the second silicon layer W2 is etched to have a step by using the first resist pattern 210 as an etching mask, so that it is possible to form the bushing part 141b and the beam part 142. At this time, the bushing part 141b may be integrated with the beam part 142.

In the step of forming the bushing part 141b and the beam part 142, the supporting members 150 for supporting the table may be formed as well.

Herein, the bushing part 141b, the beam part 142, and the supporting members 150 may be interconnected to one another. At this time, the bushing part 141b, the beam part 142, and the supporting members 150 may be formed in a body.

Figure 8:
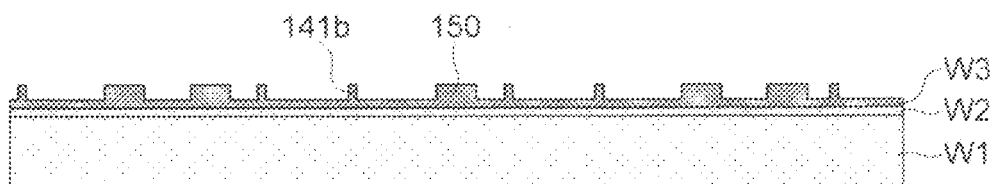
Figure 19:
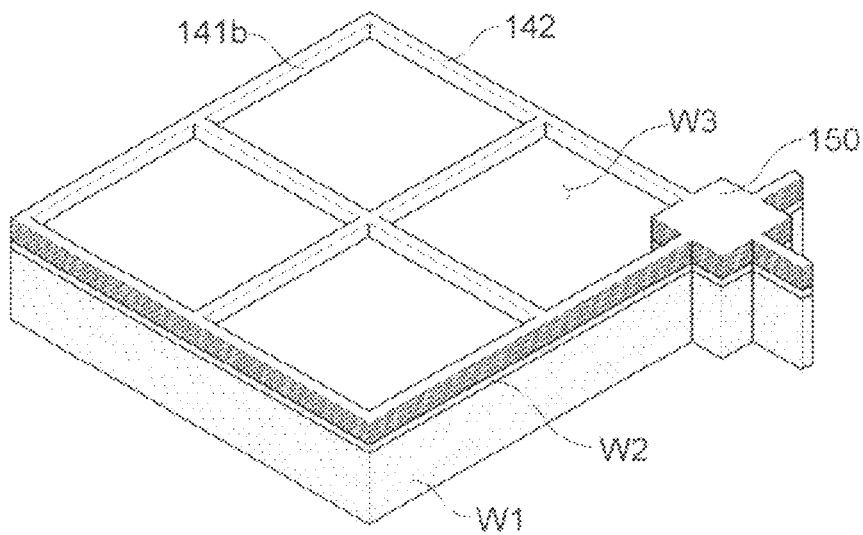

By removing the first resist pattern 210, as in FIGS. 8 and 19, the bushing part 141b, the beam part 142, and the supporting members 150 may be exposed to the outside.

Figure 9:
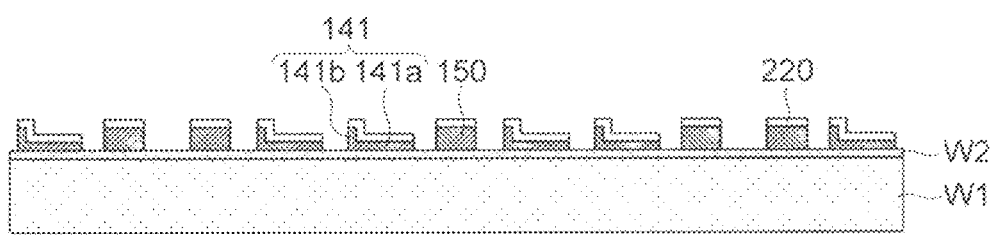

Referring to FIG. 9, the second resist pattern 220 may be formed on the plate part 141a of the second silicon layer W2 with the bushing part 141b, the beam part 142, and the supporting members 150. Herein, the second resist pattern 220 may be additionally formed on the bushing part 141b, the beam part 142, and the supporting members 150, so that the second resist pattern 220 may be protected from an etching process used for formation of the plate part 141a.

In order to form the second resist pattern 220, a resist layer is formed by either attaching a dry film or coating a photo-sensitive composition on the second silicon layer W2 with the bushing part 141b, the beam part 142, and the supporting members 150. Thereafter, the exposure and developing processes are performed for the resultant resist layer to thereby form the second resist pattern 220.

After being formed, the second resist pattern 220 is used as an etching mask for etching the second silicon layer W2 to thereby the plate part 141a.

Figure 10:
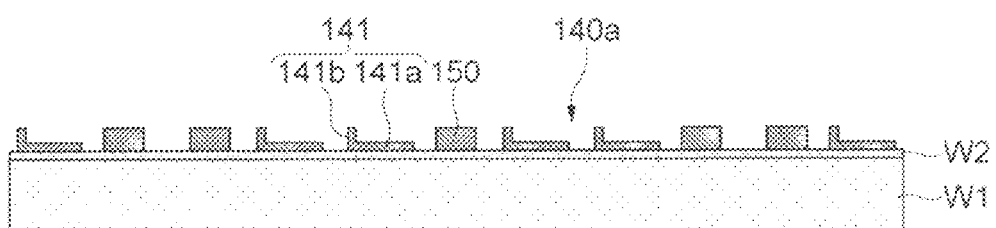
Figure 20:
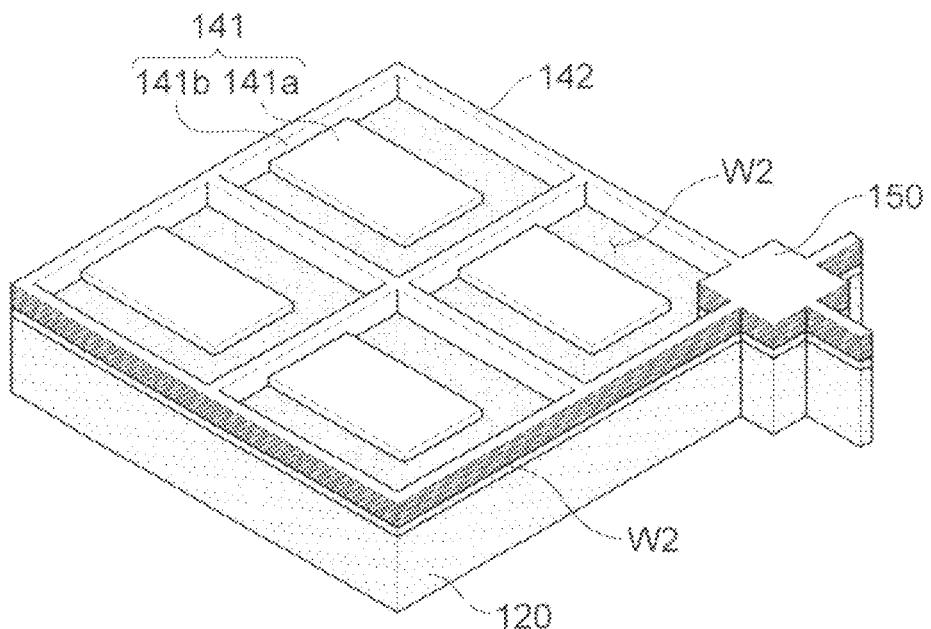

By removing the second resist pattern 220, as in FIGS. 10 and 20, the plate part 141a may be exposed to the outside.

Thus, the scratch drive arrays 140a including a plurality of the scratch drive units 141 comprised of the bushing part 141b and the plate part 141a may be formed for each cell. At this time, a plurality of scratch drive units 141 may be interconnected to one another by the beam part 142.

Although it is assumed in the embodiment of the present invention that a formation position of the bushing part 141b in the scratch drive units 141 is formed in the same direction as one another, the present invention is not limited thereto. For example, the scratch drive arrays 140a may include a plurality of scratch drive units grouped according to a formation direction of the bushing part. That is, the scratch drive arrays 140a may be formed in plural numbers.

Figure 11:
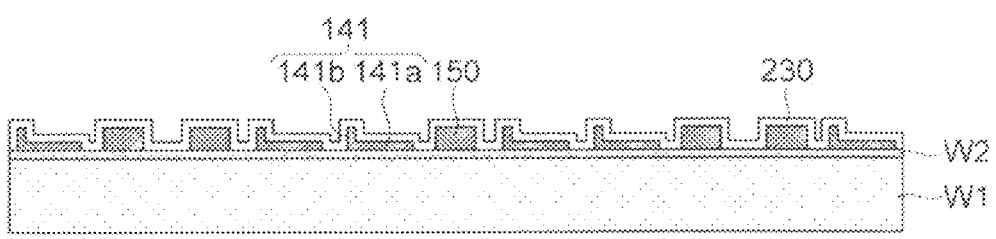

Referring to FIG. 11, a protective film 230 is formed on the first silicon layer W1 including the scratch drive arrays 140a. Herein, the protective film 230 may play a role of protecting the scratch drive arrays in a dicing process for cell division.

The protective film 230 may be formed of material with durability and chemical resistance, for example, silicon oxide film or silicon nitride film.

As for a formation method of the protective film 230, plasma chemical vapor deposition may be exemplified.

The material and formation method of the protective film are not limited by the embodiment of the present invention.

Figure 12:
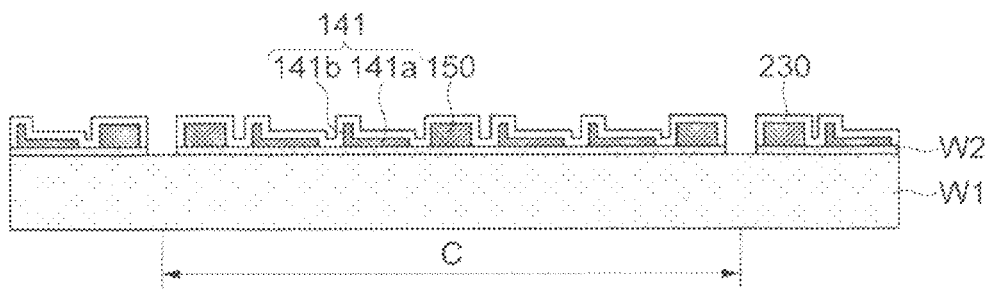
Figure 13:
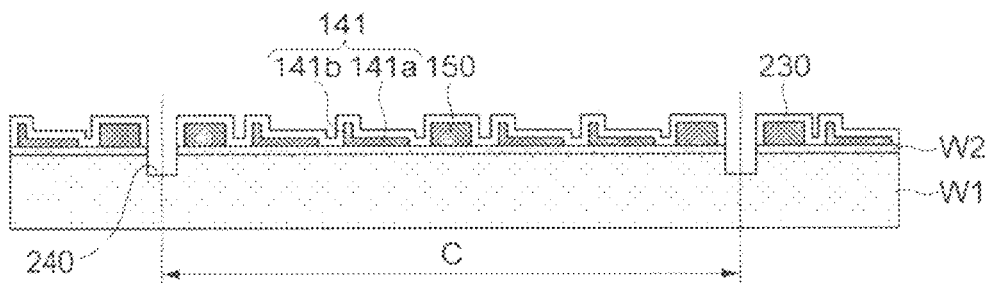

Referring to FIG. 12, after the protective film 230 is formed, the protective film 230 and the insulating layer W2 are etched for each of the cells. Thereafter, as in FIG. 13, a part of the first silicon layer W1 is further etched for each of the cells C to thereby from a dicing line 240.

Figure 14:
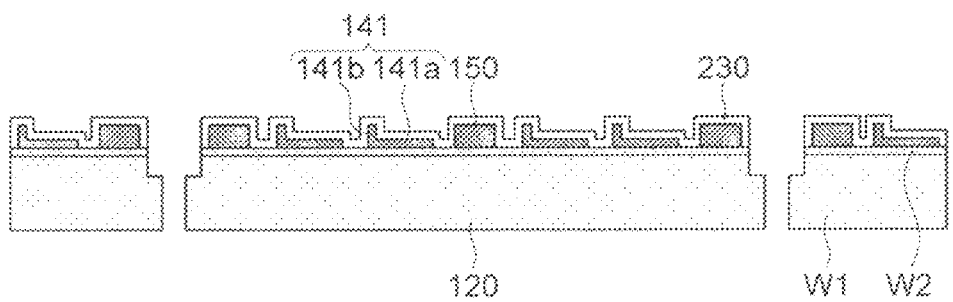

Referring to FIG. 14, after the dicing line 240 is formed, the dicing process is performed along the dicing line 240 to thereby separate cells. At this time, the first silicon layer W1 is separated for each of the cells to thereby form the table 120.

Figure 15:
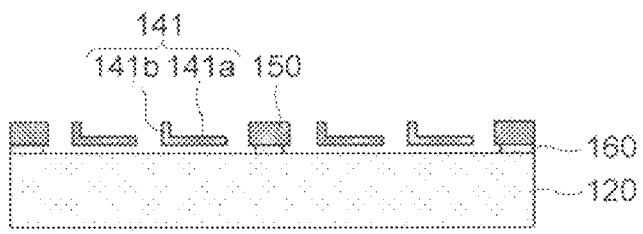
Figure 21:
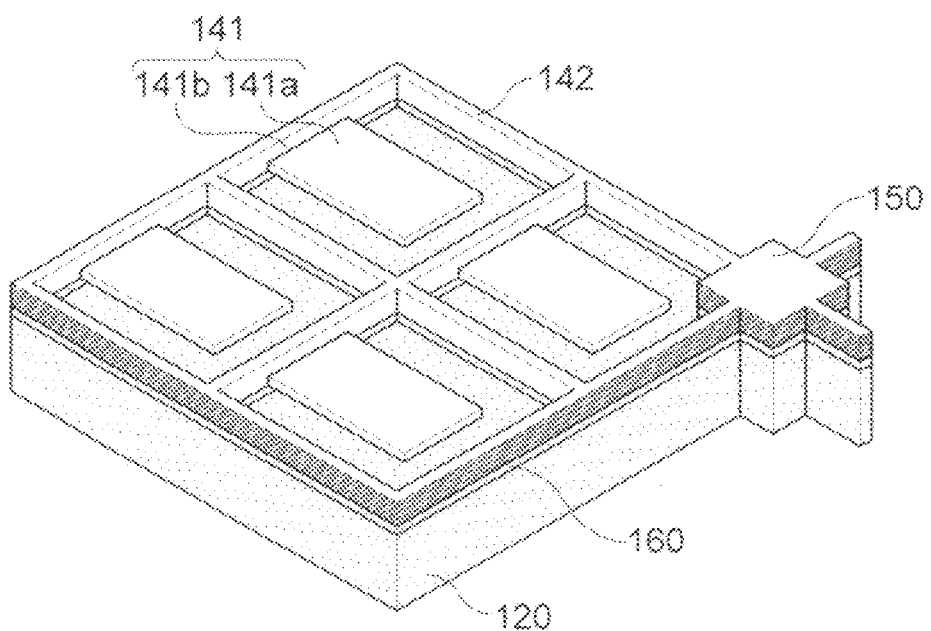

After the cells C are divided into several pieces, as in FIGS. 15 and 21, the protective film 230 is removed. Herein, in case where the protective film 230 is formed of a silicon oxide film, the protective film 230 may be removed by being immersed in a Buffered HF solution.

Thereafter, there is removed the insulating layer W2 interposed between the scratch drive units 141 and the table 120. Thus, the scratch drive units 141 may be spaced apart from the table 120. At this time, the insulating layer W2 disposed on the lower portion of the beam part 142 may be removed as well, and thus the beam part 142 may be spaced apart from the table 120.

Although not shown in the drawings, the supporting members 150 may be protected by the protective member in the step of removing the insulating layer W2. Herein, as for material of the protective member, photo-sensitive resin may be exemplified. Thus, some of the insulating layer W2 comes to remain on the lower portion of the supporting members 150, and thus the insulating pattern 160 may be naturally formed. At this time, the supporting members 150 may be connected to the table 120 by means of the insulating pattern 160 disposed on its lower portion. Herein, since a plurality of scratch drive units 141 may be connected among themselves by means of the beam part 142 and the supporting members 150, the scratch drive units 141 may be connected to the lower portion of the table 120.

Figure 16:
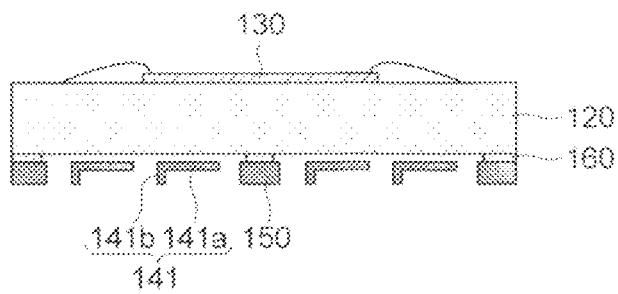

Referring to FIG. 16, the image sensor 130 is mounted on the table 120. Herein, the image sensor 130 may be mounted on the table 120 by a wire bonding scheme, but the present invention is not limited thereto. For example, the image sensor 130 may also be mounted by a flip-chip bonding scheme. Thereafter, the image sensor 130 and an external signal processing unit may be electrically interconnected to each other through the FPCB (indicated by reference numeral 170 of FIG. 1).

Figure 17:
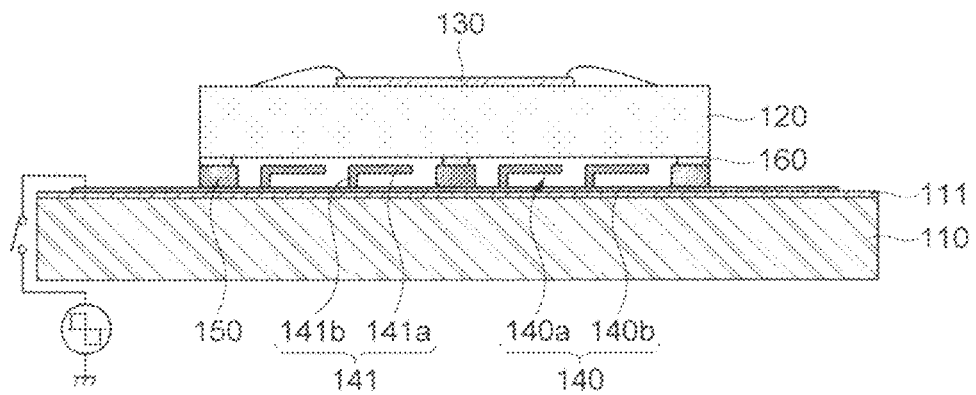
Figure 18:
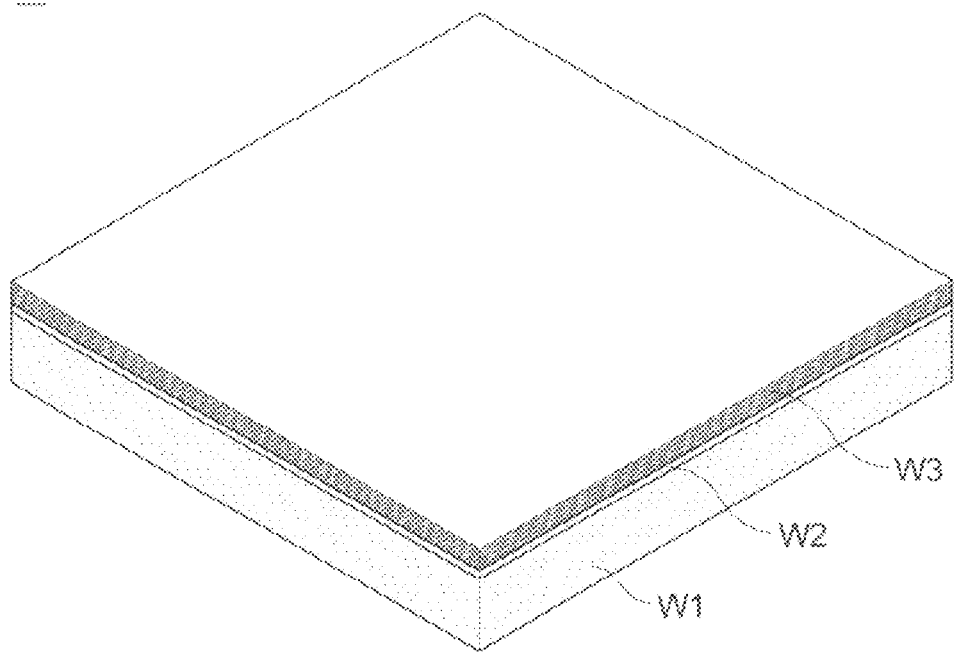
FIGS. 18 to 21 are perspective views showing a process of manufacturing the optical image stabilizer in accordance with the second embodiment of the present invention, respectively.

Referring to FIG. 17, meanwhile, the electrode layer 140b is formed on the substrate 110, the electrode layer 140b being used to generate electrostatic force required for driving of the scratch drive array 140a.

In order to form the electrode layer 140b, the insulating layer 111 is formed on the substrate 110. Herein, the insulating layer 111 may be a silicon oxide film. At this time, the insulating layer 111 may be formed by a plasma chemical vapor deposition, but the present invention is not limited thereto.

Thereafter, the electrode layer 140b is formed on the insulating layer 111. Herein, the formation of the electrode layer 140b may be made by forming a poly silicon layer on the insulating layer 111 through a Low-Pressure Chemical Vapor Deposition (LPCVD), and then etching the formed poly silicon layer. Herein, in case where the scratch drive array 140a are formed in plural numbers such that they are movable in mutually different directions, the electrode layer 140b may have been patterned to correspond to each of the scratch drive arrays 140a.

The electrode layer 140b and the scratch drive arrays 140a are disposed to face each other and the table 120 with the image sensor 130 and the scratch drive arrays 140a is mounted on the substrate 110 provided with the electrode 140b. Herein, the table 120 may be supported on the substrate by the supporting members 150. Also, the table 120 and the substrate 110 may be fixed by the electrostatic force.

Thus, as in the embodiment of the present invention, the optical image stabilizer may be manufactured by the MEMS technology, so that it is possible to reduce a mounting space of a camera device at a micrometer size, as well as to lower module's cots due to mass-production.

The optical image stabilizer of the present invention can generate a force in itself to move the image sensor by using the driving principle resulting from an attraction force, so that it is possible to implement a simple construction.

Further, the optical image stabilizer of the present invention can be manufactured by the MEMS technology, so that it is possible to reduce a mounting space of a camera device at a micrometer size, as well as to lower module's cots due to mass-production.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. An optical image stabilizer comprising:
    a substrate;
    a table which faces the substrate and has an image sensor mounted on its upper surface to be horizontally actuated on the substrate;
    supporting members for supporting the table on the substrate; and
    a scratch drive actuator for actuating the table.

2. The optical image stabilizer according to claim 1, wherein the scratch drive actuator comprises:
    an electrode layer which is disposed on the substrate and generates electrostatic force; and
    scratch drive arrays which are disposed on the electrode layer and movable in predetermined directions by the electrostatic force.

3. The optical image stabilizer according to claim 2, wherein the scratch drive arrays comprise:
    a plurality of scratch drive units which are spaced apart from the substrate, the scratch drive units each including a plate part parallel to the substrate and a bushing part bent at one side surface of the plate part; and
    a beam part for interconnecting the scratch drive units to one another.

4. The optical image stabilizer according to claim 3, wherein the scratch drive arrays are disposed between the substrate and the table.

5. The optical image stabilizer according to claim 4, wherein the electrode layer includes an electrode pattern patterned to correspond to each of the scratch drive arrays.

6. The optical image stabilizer according to claim 4, wherein the scratch drive arrays are movable in mutually different directions from one another.

7. The optical image stabilizer according to claim 3, wherein the supporting members and the beam parts are formed in a body.

8. The optical image stabilizer according to claim 2, wherein the electrode layer is formed of a conductor made of metal or poly silicon.

9. The optical image stabilizer according to claim 2, wherein the scratch drive arrays are formed of silicon.

10. The optical image stabilizer according to claim 1, further comprising an insulating pattern interposed between the supporting members and the table.

11. The optical image stabilizer of claim 1, wherein the table is formed of silicon.

12. The optical image stabilizer according to claim 1, wherein the image sensor is mounted by a wire bonding scheme or a flip-chip bonding scheme.

* * * * *